United States Patent
Katiner

(10) Patent No.: US 8,368,817 B2
(45) Date of Patent: Feb. 5, 2013

(54) FILTER DEVICE

(75) Inventor: Axel Katiner, Seevetal (DE)

(73) Assignee: NXP B.V., Eindhoven (NL)

( * ) Notice: Subject to any disclaimer, the term of this patent is extended or adjusted under 35 U.S.C. 154(b) by 1033 days.

(21) Appl. No.: 12/161,078

(22) PCT Filed: Jan. 16, 2007

(86) PCT No.: PCT/EP2007/000331
§ 371 (c)(1),
(2), (4) Date: Jul. 16, 2008

(87) PCT Pub. No.: WO2007/080132
PCT Pub. Date: Jul. 19, 2007

(65) Prior Publication Data
US 2010/0157164 A1   Jun. 24, 2010

(30) Foreign Application Priority Data

Jan. 16, 2006  (EP) .................... 06100400

(51) Int. Cl.
H04N 5/455  (2006.01)
H04N 5/50  (2006.01)
H04N 5/44  (2011.01)
(52) U.S. Cl. ............. 348/726; 348/731; 348/725
(58) Field of Classification Search .......... 348/726, 348/731, 725
See application file for complete search history.

(56) References Cited

U.S. PATENT DOCUMENTS

| | | | |
|---|---|---|---|
| 6,667,760 B1 | 12/2003 | Limberg | |
| 6,982,584 B2 * | 1/2006 | Melly | 327/254 |
| 7,375,582 B2 * | 5/2008 | Stikvoort | 327/552 |
| 2002/0047942 A1 * | 4/2002 | Vorenkamp et al. | 348/731 |
| 2003/0001648 A1 * | 1/2003 | Okazaki et al. | 327/252 |
| 2003/0072284 A1 * | 4/2003 | Webster et al. | 370/335 |
| 2005/0075089 A1 | 4/2005 | Iida | |
| 2005/0220224 A1 | 10/2005 | Dornbusch | |
| 2006/0067429 A1 * | 3/2006 | Beyer et al. | 375/309 |
| 2006/0092320 A1 * | 5/2006 | Nickerson et al. | 348/441 |
| 2009/0058538 A1 * | 3/2009 | Kantor et al. | 331/45 |

FOREIGN PATENT DOCUMENTS

GB   2244611 A   12/1991

OTHER PUBLICATIONS

Kobayashi H et al, "Explicit Transfer Function of RC Polyphase Filter for Wireless Transceiver Analog Front-End", ASIC, 2002; Proceedings, 2002 IEEE Asia-Pacific Conference on Aug. 6-8, 2002, Piscataway, NJ, USA, IEEE; Aug. 6, 2002, p. 137-140, XP010602812.

* cited by examiner

Primary Examiner — Pankaj Kumar
Assistant Examiner — Franklin Andramuno
(74) Attorney, Agent, or Firm — Kramer & Amado P.C.

(57) ABSTRACT

The invention relates to a filter device particularly for receiving television signals, which receives input signals and generates output signals, wherein the filter device forms a Nyquist slope by means of a passive polyphase filter (10).

9 Claims, 4 Drawing Sheets

FILTER DEVICE

FIELD OF THE INVENTION

The invention relates to a filter device particularly for devices for receiving television signals as well as a device for receiving television signals including a filter device.

Filter devices for devices for receiving television signals are known both for receiving analog television signals and for receiving digital television signals. With analog television signals, the transmission is achieved with a vestigial sideband modulation. This means that the sidebands are asymmetrically designed. In order to determine the baseband signal here, a Nyquist slope is therefore necessary, which brings the difference in the amplitude of the double-sideband range and of the single-sideband range into line with each other.

BACKGROUND OF THE INVENTION

In known receiving devices the Nyquist slope is realized in the IF frequency range by external, what are referred to as SAW filters, which are also called Surface Acoustic Wave filters. These SAW filters produce channel selectivity and form a Nyquist slope. Due to the multiplicity of television standards worldwide, SAW filters forming different Nyquist slopes are necessary. These SAW filters forming different Nyquist slopes differ in the bandwidth, intermediate frequency and the width of the double-sideband range.

In more recent receiving devices, according to newer concepts for receiving multi-standard television signals, a window-SAW-filter is used instead of a multiplicity of SAW filters. The external SAW filter can also be avoided by an internal selectivity. In both cases, an integration of a Nyquist slope must be realized in order to be able to realize an analog television signal reception.

Typically, a window-SAW-filter is used for receiving digital television signals.

OBJECT AND SUMMARY OF THE INVENTION

It is an object of the invention to design a filter device for receiving a vestigial sideband modulated signal particularly for receiving television signals with a Nyquist slope, which device needs reduced expenditure regarding the integration of hybrid television reception and has a common filter for analog and digital television signal reception. The filter device should bring the amplitude of the double-sideband range into line with the amplitude of the single-sideband range at least substantially. Further, it is an object to provide a device for receiving television signals including a filter device.

The object, according to the invention, is achieved in accordance with the characteristics of claim 1 and claim 9. Advantageous further embodiments are described in the dependent claims.

Advantageously, the invention provides a filter device particularly intended for receiving television signals, which receives input signals and generates output signals, wherein the filter device forms a Nyquist slope by means of a passive polyphase filter. Thus, the device can be used with a window-SAW-filter, which is also used for receiving digital television signals.

It is particularly advantageous, if the passive polyphase filter has at least one or a plurality of simple passive polyphase filter stages.

For using the filter device for different television standards it is expedient for the device to have a plurality of simple passive polyphase filter stages.

Particularly advantageous is the arrangement comprising a first simple passive polyphase filter stage, which is designed in such a way that each input phase ($\phi$) is connected to the output of the same phase ($\phi$) by means of a resistor $R_2$, furthermore, a capacitor C connects the input of a phase ($\phi$) to the output of a subsequent phase ($\phi+90°$) respectively and resistor $R_1$ connects an input of a phase ($\phi$) to the inverted output ($\phi+180°$) respectively.

Furthermore, it is expedient if a second simple passive polyphase filter stage is designed in such a way that each input phase ($\phi$) is connected to the output of the same phase ($\phi$) by means of a resistor R and furthermore, a capacitor C connects the input of a phase ($\phi$) to the output of a subsequent phase ($\phi+90°$) respectively.

It is particularly advantageous, if at least one first simple polyphase filter stage is used. In addition, it may be expedient if before or after the first simple polyphase filter stage further and different polyphase filter stages are also provided if necessary. Herein, the sequence of the individual passive polyphase filter stages may be interchanged.

It is particularly advantageous that a good linearity is achieved, because no active components are needed. The Nyquist filter can also be extended to a filter for suppressing the image frequencies, in order to reduce or prevent interference from the adjacent channels.

These and other aspects of the invention are apparent from and will be elucidated with reference to the embodiments described hereinafter.

DESCRIPTION OF EMBODIMENTS

Figure 1:
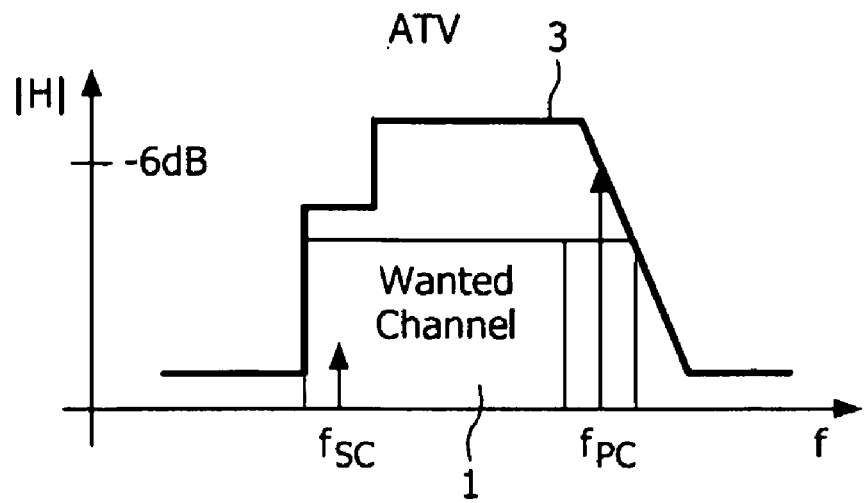
FIG. 1 gives a representation of an external SAW filter with a Nyquist slope for receiving analog television signals according to the state of art.
Figure 2:
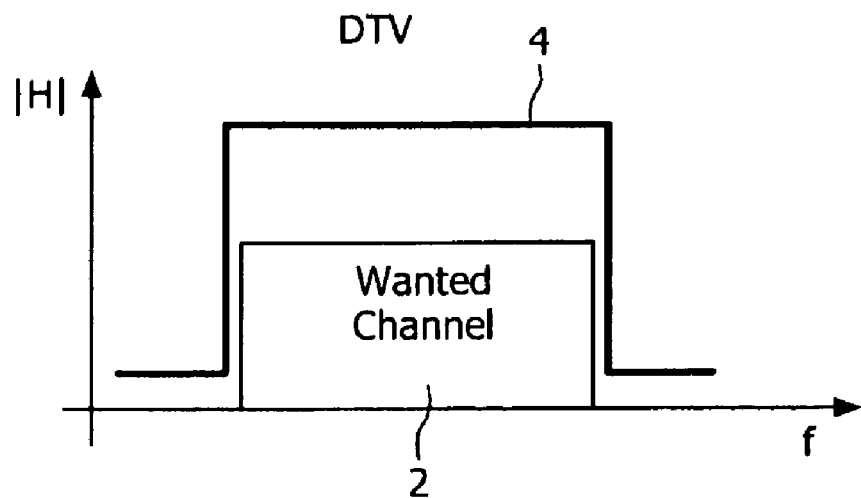
FIG. 2 gives a representation of a window SAW filter with a Nyquist slope for receiving digital television signals.
Figure 3:
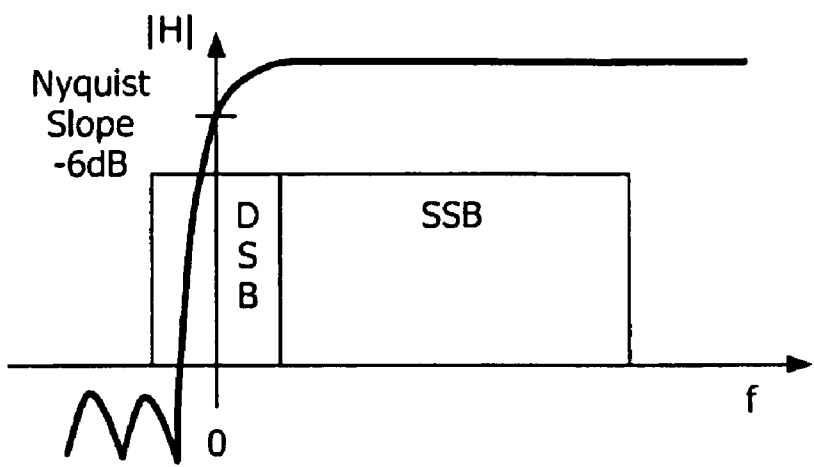
FIG. 3 shows a diagram with a Nyquist slope in the baseband, FIG. 4 gives a schematic representation of a filter device according to the invention, FIG. 5a gives a schematic representation of a simple passive polyphase filter stage.

FIG. 1 shows an external SAW filter with a Nyquist slope for receiving analog television signals (ATV) and FIG. 2 shows a window SAW filter for receiving digital television signals (DTV). Here, the desired channel 1, 2 below the curve 3, 4 respectively of the respective filter is selected corresponding to the transfer function of the filter. For this purpose, FIG. 3 shows a diagram with a Nyquist slope in the baseband and the demodulated television signal. In the baseband the complex demodulated television signal comprises a double-sideband range (DSB), which is symmetrical around 0 Hz and a single-sideband range (SSB), which comprises the higher video frequencies. The picture carrier is at 0 Hz after the demodulation. The Nyquist slope in the baseband functions around 0 Hz and brings the DSB signal into line with the level of the SSB signal.

Figure 4:
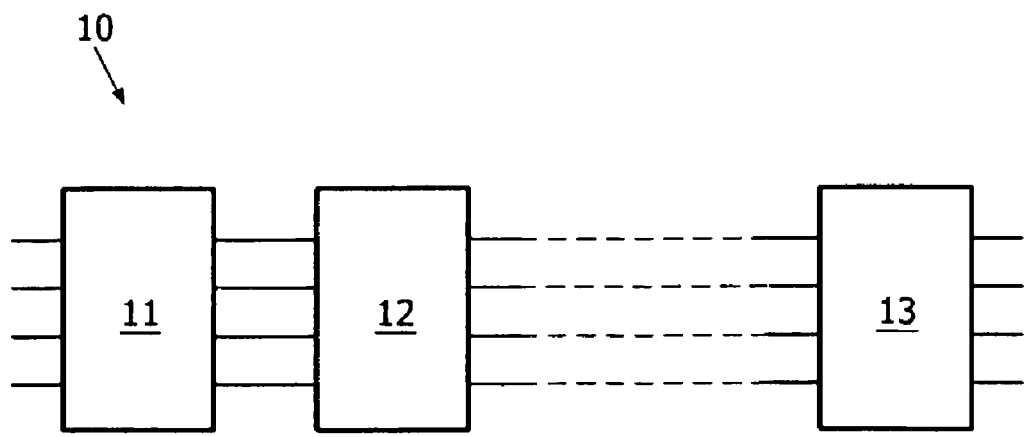

The invention proposes to carry out a filtering with a Nyquist slope by means of a passive polyphase filter 10, as represented in FIG. 4. The complex demodulation produces a 4-phase signal at 0°, 90°, 180° and 270°. These four phases are supplied to the passive polyphase filter 10, which comprises one or a plurality of simple passive polyphase filter stages 11, 12, 13. Here, the stages 11, 12, 13 may comprise, for example, one of the filter stages represented in the FIG. 5a or 6a.

Figure 5A:
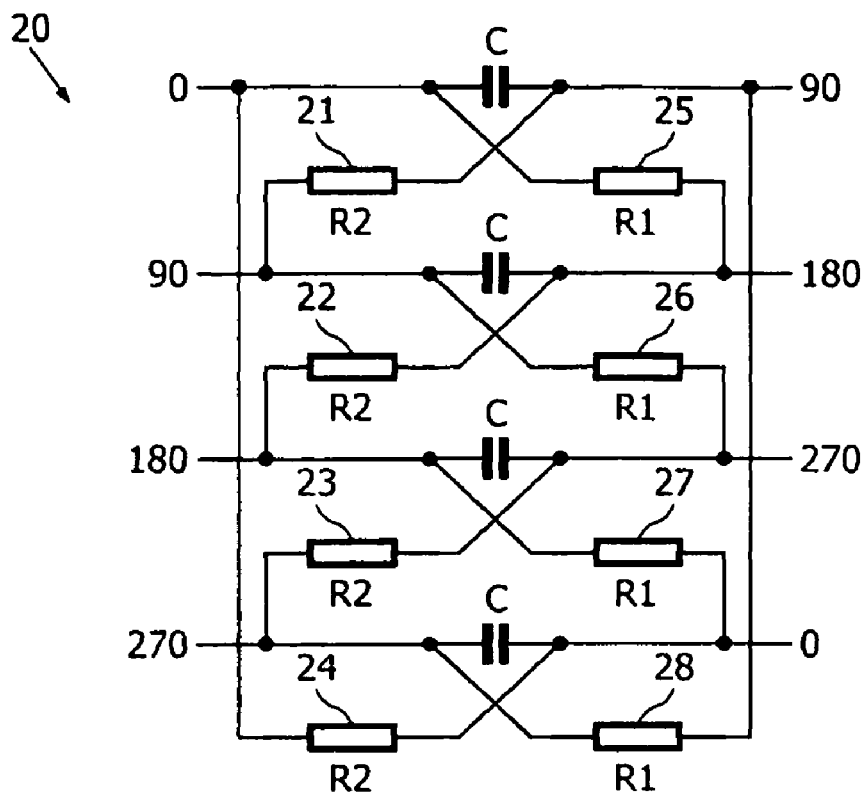
FIG. 5b shows a diagram of an amplitude response as a function of frequency, FIG. 6a gives a schematic representation of a simple passive polyphase filter stage.

The simple passive polyphase filter stage according to FIG. 5a is formed in such a way that each input phase is connected to the output of the same phase by means of a resistor $R_2$. At the same time, a capacitor C connects the input of a phase φ to the output of a subsequent phase (φ+90°). The resistors $R_1$ connect the input of a phase φ to the inverted output (p+180°) respectively.

In FIG. 5a one recognizes a total of four inputs with a 0°, 90°, 180° and 270° phase shift on the left side of the representation of the filter stage, wherein each input phase (φ) is connected to the output of the same phase (φ) represented on the right by means of a resistor $R_2$, 21, 22, 23, 24. At the same time a capacitor C connects the input of a phase (φ) to the output of a subsequent phase (φ+90°) respectively, thus the input of the phase at 0° to the output of phase at 90° etcetera. Accordingly, it is effected that the resistors $R_1$, 25, 26, 27, 28 connect the input of a phase φ to the inverted output (φ+180°), such as, for example, the input of the phase at 0° to the output of the phase at 180°.

The simple passive polyphase filter stage according to FIG. 5a has the following transfer function $H_1(p)$:

$$H_1(p) = \frac{pC_1 + j\left(\frac{1}{R_2} - \frac{1}{R_1}\right)}{pC_1 + \left(\frac{1}{R_2} + \frac{1}{R_1}\right)}$$

This transfer function has a zero position with the imaginary frequency $f_{01}$:

$$f_{01} = -j\frac{1}{2\pi}\frac{R_1 - R_2}{R_1 R_2 C_1}$$

and has a pole with the negative real frequency $f_{x1}$:

$$f_{x1} = -\frac{1}{2\pi}\frac{R_1 + R_2}{R_1 R_2 C_1}$$

Figure 5B:
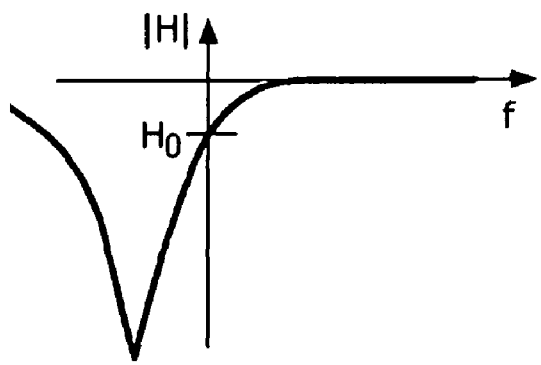

The amplitude response IHI is represented in FIG. 5b as a function of the frequency f. The absolute value of the transfer function with frequency f=0 is:

$$|H_1(p=0)| = \frac{\frac{1}{R_2} - \frac{1}{R_1}}{\frac{1}{R_2} + \frac{1}{R_1}} = \frac{R_1 - R_2}{R_1 + R_2} = H_0$$

Figure 6A:
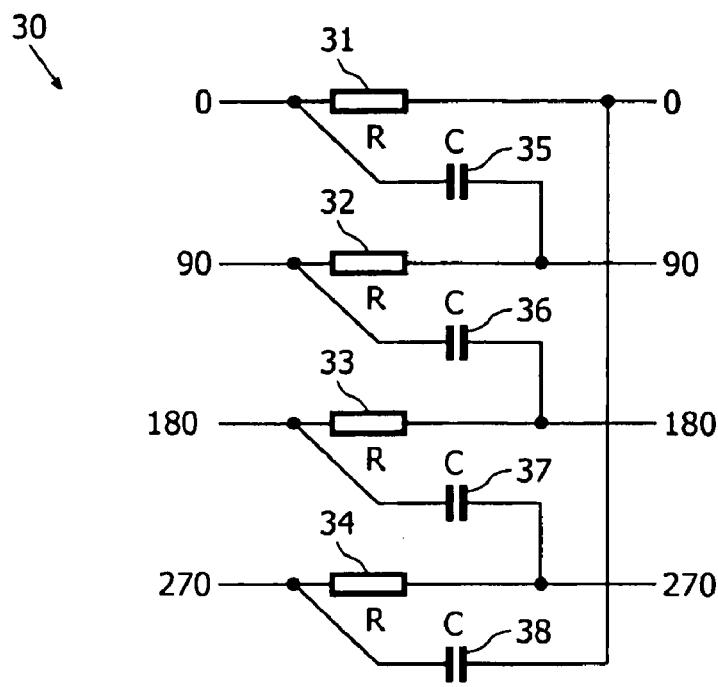
FIG. 6b shows a diagram of an amplitude response as a function of frequency.
Figure 6B:
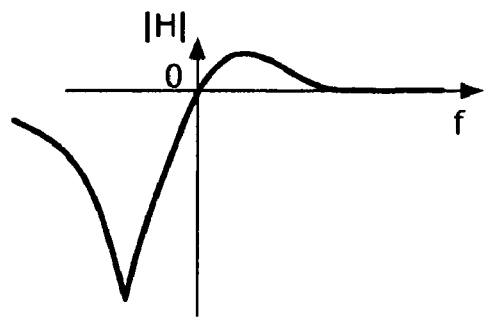

FIG. 6b shows a further simple passive polyphase filter stage 30, which is formed in such a way that each input (φ), in FIG. 6a on the left, is connected to the output of the same phase (φ) by means of a resistor R, 31, 32, 33, 34, in FIG. 6a on the right. At the same time a capacitor C, 35, 36, 37, 38 connects the input of a phase (φ) to the output of a following phase ((φ)+90°).

The transfer function results in:

$$H_2(p) = \frac{\frac{1}{R} - jpC}{\frac{1}{R} + pC}$$

The transfer function has a zero position with the imaginary frequency $f_{02}$:

$$f_{02} = -j\frac{1}{2\pi}\frac{1}{RC}$$

and has poles with negative real frequency $f_{x2}$:

$$f_{x2} = -\frac{1}{2\pi}\frac{1}{RC}$$

The amplitude response IHI is represented in FIG. 6b as a function of the frequency f. The absolute value of the transfer function with frequency f=0 is:

$$|H_2(p=0)| = \frac{\frac{1}{R}}{\frac{1}{R}} = 1 = 0 \text{ dB}$$

In order to form a Nyquist slope, a simple passive polyphase filter stage according to FIG. 5a is expedient. The zero position of this stage can be set on the negative end of the double-sideband range with $f_0$=−1.25 MHz for the television standards I and L and −0.75 MHz for the television standards M, N, B, G, D and K. Furthermore, the absolute value of the transfer function in the case f=0 is set to ½, thus to −6 dB. Hence R1=3*R2 is the result.

In order to use one Nyquist slope for various television standards and manage a process variation it is suggested according to the invention that the zero position be shifted to a lower frequency particularly nearer to 0 Hz and that the higher negative frequencies of the double-sideband signal be suppressed by additional simple passive polyphase filter stages as represented in FIG. 3 in the diagram of an amplitude response as a function of the frequency.

Here, the further simple passive polyphase filter stages may be stages according to FIG. 5a or FIG. 6a. With the use of a passive polyphase filter with N stages the absolute value of the cumulative transfer function results in:

$$|H(p=0)| = H_{10} * H_{20} * \ldots * H_{N0} = \frac{1}{2}.$$

Using a plurality of different stages allows the image frequency gain over a further frequency range and the optimization of the amplitude waviness of the passband.

Figure 7:
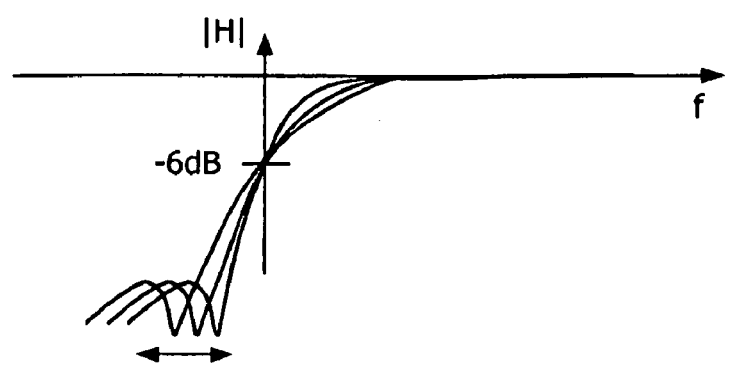
FIG. 7 shows a diagram of an amplitude response as a function of frequency.

FIG. 7 shows that the Nyquist slope turns at 0 Hz or −6 dB respectively as a result of a process variation or a temperature fluctuation and the zero positions are dependent on the frequency. Thus the picture contents, which are more strongly amplified with negative frequencies, are more present with positive frequencies and vice versa. This means that a process variation and a possible temperature fluctuation do not have any special influence on the characteristic of the output signal.

The invention claimed is:

1. A filter device comprising:
   a receiver of input signals;
   a generator of output signals; and
   a passive polyphase filter that forms a Nyquist slope, wherein the passive polyphase filter further comprises:
   first resistors configured to connect each input phase to an output having an identical phase;
   capacitors configured to connect each input phase to an output of a subsequent phase spaced by 90 degrees; and
   second resistors configured to connect each input phase to an output of a subsequent phase spaced by 180 degrees.

2. The filter device as claimed in claim 1, wherein the passive polyphase filter comprises a plurality of simple passive polyphase filter stages.

3. The filter device as claimed in claim 1, wherein the passive polyphase filter comprises a plurality of simple passive polyphase filter stages, and each of the filter stages respectively corresponds to a different television standard.

4. The filter device of claim 1, further comprising:
   a first simple passive polyphase filter stage.

5. The filter device of claim 4, further comprising:
   a second simple passive polyphase filter stage.

6. The filter device as claimed in claim 1, further comprising:
   at least one first simple polyphase filter stage.

7. The filter device as claimed in claim 1, further comprising:
   at least two different polyphase filter stages.

8. The filter device as claimed in claim 1, wherein the filter device is realized as an integrated circuit.

9. A device for receiving television signals including the filter device as claimed in claim 1.

* * * * *